US012787452B2

(12) United States Patent
Yamada

(10) Patent No.: US 12,787,452 B2
(45) Date of Patent: Nov. 3, 2026

(54) PHOTOELECTRIC CONVERSION DEVICE, PHOTOVOLTAIC DEVICE, AND METHOD FOR MANUFACTURING PHOTOELECTRIC CONVERSION DEVICE

(71) Applicant: KABUSHIKI KAISHA TOSHIBA, Tokyo (JP)

(72) Inventor: Nobuhide Yamada, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 19/068,235

(22) Filed: Mar. 3, 2025

(65) Prior Publication Data

US 2025/0301799 A1 Sep. 25, 2025

(30) Foreign Application Priority Data

Mar. 22, 2024 (JP) ................................ 2024-045857

(51) Int. Cl.
*H10F 10/13* (2025.01)
*H01Q 1/24* (2006.01)
*H10F 19/90* (2025.01)

(52) U.S. Cl.
CPC ............ *H10F 10/13* (2025.01); *H01Q 1/248* (2013.01); *H10F 19/902* (2025.01)

(58) Field of Classification Search
None
See application file for complete search history.

(56) References Cited

U.S. PATENT DOCUMENTS

| | | | | |
|---|---|---|---|---|
| 8,115,683 | B1 * | 2/2012 | Stefanakos | H10F 77/143 136/255 |
| 9,437,629 | B1 * | 9/2016 | Davids | H10F 30/22 |
| 11,296,240 | B1 * | 4/2022 | Davids | H10F 10/14 |
| 2006/0181188 | A1 | 8/2006 | Koh et al. | |
| 2008/0048210 | A1 | 2/2008 | Shima | |
| 2009/0280585 | A1 | 11/2009 | Koh et al. | |
| 2010/0243041 | A1 * | 9/2010 | Carlson | H10F 10/146 257/E31.127 |
| 2011/0163920 | A1 | 7/2011 | Cutler | |
| 2012/0028396 | A1 * | 2/2012 | Gilman | H10F 10/14 257/E31.124 |
| 2012/0208354 | A1 | 8/2012 | Shima | |

(Continued)

FOREIGN PATENT DOCUMENTS

| | | |
|---|---|---|
| JP | S58100459 | 6/1983 |
| JP | 4992710 B2 | 8/2012 |
| JP | 5153075 B2 | 2/2013 |

(Continued)

*Primary Examiner* — Ryan S Cannon
(74) *Attorney, Agent, or Firm* — Knobbe, Martens, Olson & Bear, LLP

(57) ABSTRACT

According to an embodiment, a photoelectric conversion device includes an emitter electrode, an anode electrode, an insulator, and a fixed charge portion. The emitter electrode receives incident light having a predetermined wavelength and emits electrons. The anode electrode absorbs the electrons. The insulator supports the emitter electrode and the anode electrode. The fixed charge portion generates an electric field for giving the electrons a potential to help to jump out from the emitter electrode and move toward the anode electrode.

9 Claims, 8 Drawing Sheets

(56) References Cited

U.S. PATENT DOCUMENTS

2013/0146117 A1* 6/2013 Brady .................... H01Q 1/248
136/201

FOREIGN PATENT DOCUMENTS

| | | | |
|---|---|---|---|
| JP | 2016034041 | A | 3/2016 |
| JP | 2021111721 | A | 8/2021 |
| WO | WO 2004084313 | A1 | 9/2004 |

* cited by examiner

PHOTOELECTRIC CONVERSION DEVICE, PHOTOVOLTAIC DEVICE, AND METHOD FOR MANUFACTURING PHOTOELECTRIC CONVERSION DEVICE

CROSS-REFERENCE TO RELATED APPLICATIONS

This application is based upon and claims the benefit of priority from Japanese Patent Application No. 2024-045857, filed on Mar. 22, 2024; the entire contents of which are incorporated herein by reference.

FIELD

Embodiments described herein relate generally to a photoelectric conversion device, a photovoltaic device, and a method for manufacturing a photoelectric conversion device.

BACKGROUND

In the related art, a rectenna (rectifier+antenna) is known as an element that uses a diode to rectify internal vibration of an electric field generated by an electromagnetic wave captured by an antenna and to convert the internal vibration into a current.

Among these rectennas, there is an optical rectenna that operates in a frequency band of light and utilizes the wave nature of light.

DETAILED DESCRIPTION

According to an embodiment, a photoelectric conversion device includes an emitter electrode, an anode electrode, an insulator, and a fixed charge portion. The emitter electrode receives incident light having a predetermined wavelength and emits electrons. The anode electrode absorbs the electrons. The insulator supports the emitter electrode and the anode electrode. The fixed charge portion generates an electric field for giving the electrons a potential to help to jump out from the emitter electrode and move toward the anode electrode.

Figure 1:
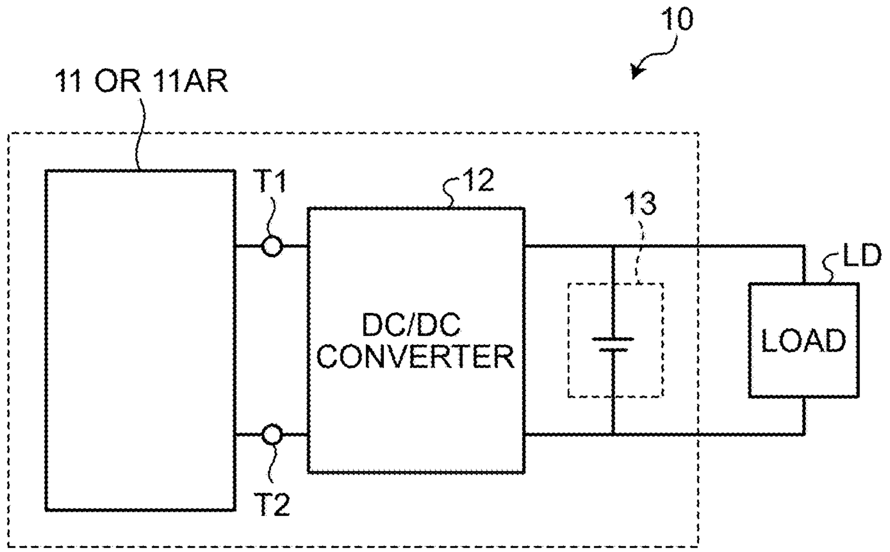
FIG. 1 is an explanatory diagram of the principle of an optical rectenna power supply system.

FIG. 1 is an explanatory diagram of the principle of an optical rectenna power supply system.

An optical rectenna power supply system 10 includes an optical rectenna 11 or an optical rectenna array 11AR, a DC/DC converter 12, and a storage battery unit 13. Note that a circuit element group such as a band pass filter (not illustrated) may be included.

The optical rectenna 11 receives an electromagnetic wave in a frequency band of light, and performs photoelectric conversion using the wave nature of the electromagnetic wave. In the optical rectenna array 11AR, the optical rectennas 11 are disposed in an array and perform photoelectric conversion.

Here, the principle and configuration of the optical rectenna will be described.

Figure 2:
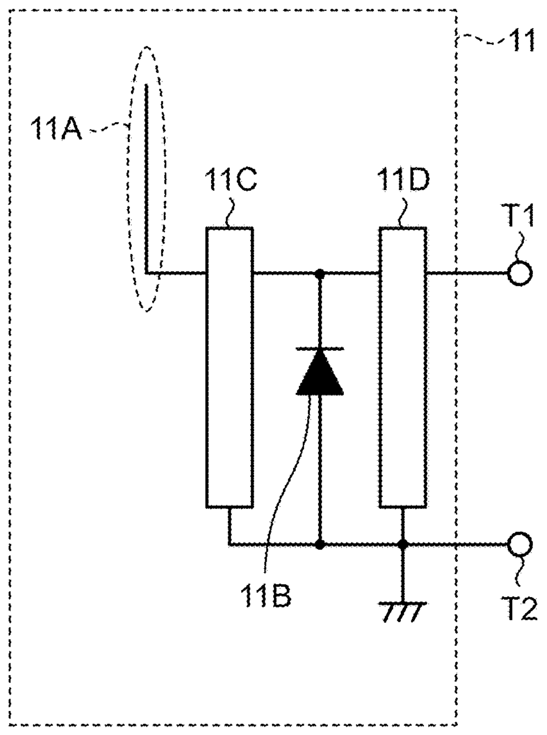
FIG. 2 is an explanatory diagram of the principle and configuration of an optical rectenna.

FIG. 2 is an explanatory diagram of the principle and configuration of an optical rectenna.

The optical rectenna 11 includes: an antenna unit 11A, as a ¼ wavelength antenna, that receives light having a predetermined wavelength such as visible light or infrared light and photoelectrically converting the received light; a diode 11B that rectifies a current obtained by photoelectric conversion by the antenna unit 11A; a circuit element group 11C that is provided at a preceding stage of the diode 11B, includes capacitance (not illustrated) and the like, and extracts a direct current; and a circuit element group 11D that is provided at a subsequent stage of the diode 11B, includes capacitance (not illustrated) and the like, and extracts a direct current.

That is, the antenna unit 11A of the optical rectenna 11 receives light having a predetermined wavelength such as visible light or infrared light, photoelectrically converts the received light, and continuously generates a current.

The current generated in this way is supplied to the diode 11B via the circuit element group 11C and the circuit element group 11D, rectified by the diode 11B, and output as a direct current through terminals T1 and T2.

The DC/DC converter 12 performs DC/DC conversion of the output power output from the optical rectenna 11 or the optical rectenna array 11AR through the terminals T1 and T2, and outputs direct current power having a predetermined direct current voltage.

The storage battery unit 13 stores the direct current power output from the DC/DC converter 12 and supplies the stored direct current power to a coupled load LD.

(1) First Embodiment

Figure 3:
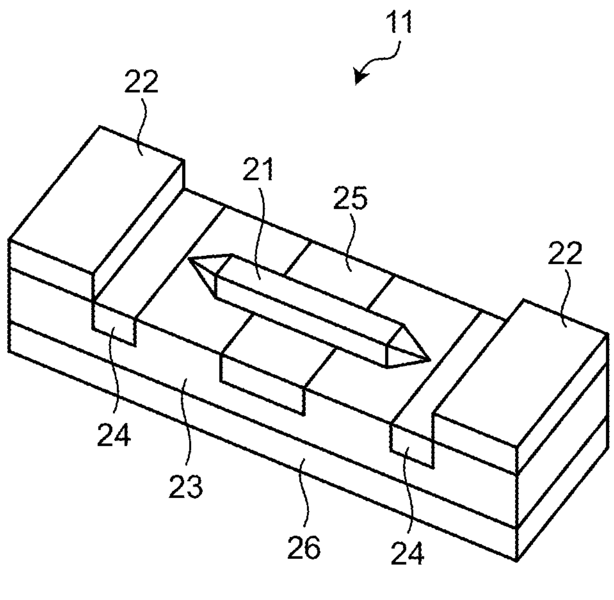
FIG. 3 is an external perspective view of an optical rectenna of a first embodiment.

FIG. 3 is an external perspective view of an optical rectenna of a first embodiment.

The optical rectenna 11 includes an emitter electrode 21, an anode electrode 22, an insulator 23, a fixed charge portion 24, buried electron supply wiring 25, and a substrate 26.

The emitter electrode 21 functions as an antenna, and receives incident light and emits electrons ($e^-$) obtained by photoelectric conversion to the anode electrode 22 side as described later.

In this case, for the purpose of facilitating field emission, each of both end portions of the emitter electrode 21 has a shape that is gradually narrowed toward the tip, has a small radius of curvature at the tip (i.e., the tip is pointed), and is likely to cause concentration of electric field. For example, a central portion may have a prismatic shape or a plate shape, and both end portions may have a pyramidal shape, or a conical shape. It is conceivable that the central portion has a prismatic shape or a plate shape, each of both end portions has a triangular shape in plan view, and the shape in plan view is a hexagonal shape or a parallelogram shape as a whole.

The length of the emitter electrode 21 is determined depending on the wavelength of light to be photoelectrically converted, and is about 200 nm or less. For example, since the wavelength of yellow or the vicinity thereof having relatively high luminance in the sunlight is about 500 nm, the ¼ wavelength is about 125 nm, and the length of the emitter electrode 21 is also about 125 nm. Since the wavelength of blue is 400 nm or less, the length of the emitter electrode 21 is about 100 nm or less. Since the wavelength of red is about 800 nm, the length of the emitter electrode 21 is about 200 nm or less.

The anode electrode 22 absorbs electrons emitted from the emitter electrode 21.

In this case, the anode electrode 22 is disposed, for example, at a position separated by about 20 nm from the tip of the emitter electrode.

The insulator 23 supports the emitter electrode 21 and the anode electrode 22.

The fixed charge portion 24 is formed at a predetermined position on the insulator 23, and generates an electric field for giving electrons a potential to help to jump out from the emitter electrode 21 and move toward the anode electrode 22.

In this case, the predetermined position at which the fixed charge portion 24 is formed is a position that is on the side of the path along which the electrons $e^-$ emitted from the emitter electrode 21 move toward the anode electrode 22 as well as that is sufficient for the electric field generated by the fixed charge portion 24 on the side of the path to affect the emission of the electrons $e^-$.

Further, the fixed charge portion 24 is separated by a predetermined distance from the emitter electrode 21 in a direction from the emitter electrode 21 toward the anode electrode 22. Examples of the above include a position separated by about 10 nm from the tip of the emitter electrode in the direction from the emitter electrode 21 toward the anode electrode 22.

The buried electron supply wiring 25 supplies, to the emitter electrode 21 functioning as an antenna, electrons so as to supplement the emitter electrode 21 with electrons corresponding to the amount emitted and lost by the emitter electrode 21.

The substrate 26 includes glass, resin, silicon, or the like, supports the emitter electrode 21, the anode electrode 22, the insulator 23, the fixed charge portion 24, and the buried electron supply wiring 25, and maintains the mechanical strength of the optical rectenna 11.

Here, a procedure of manufacturing an optical rectenna will be described.

Figure 4:
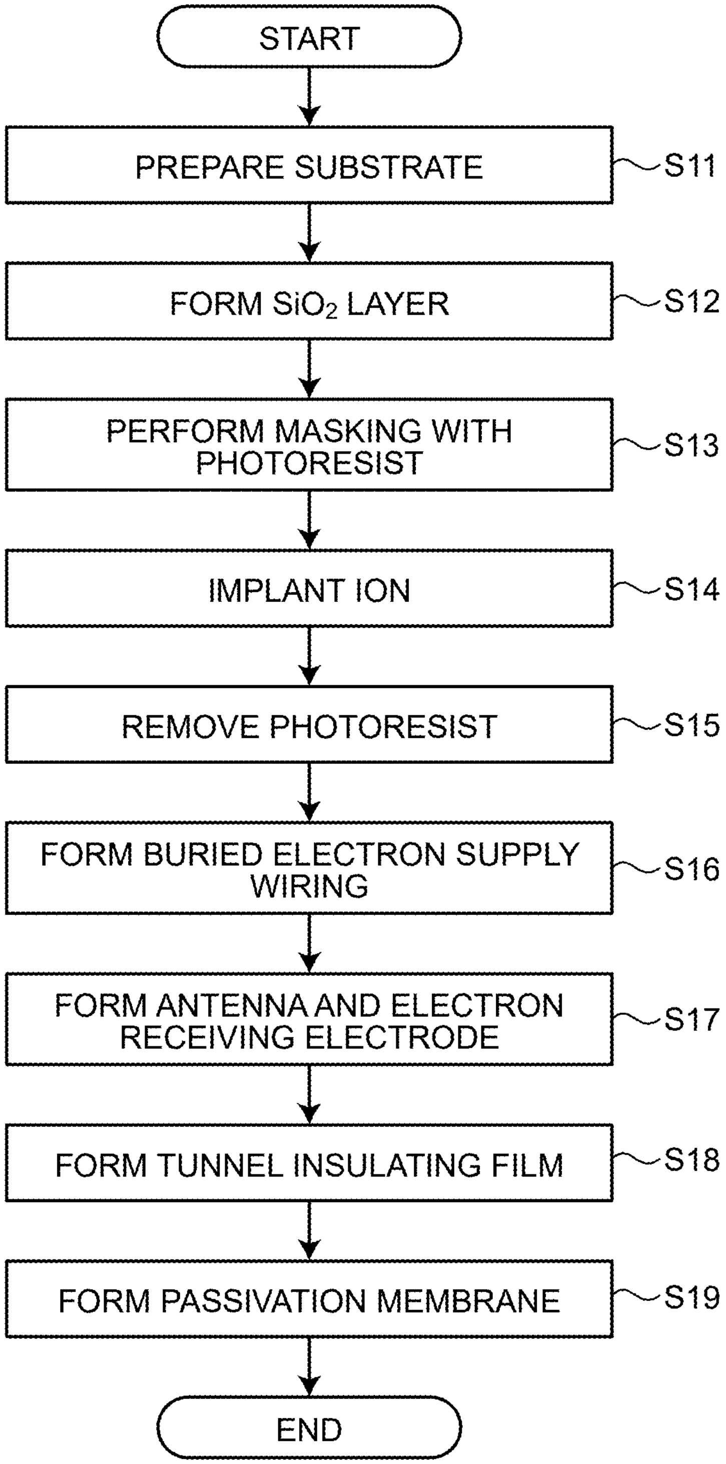
FIG. 4 is a flowchart of a process of manufacturing an optical rectenna.

FIG. 4 is a flowchart of a process of manufacturing an optical rectenna.

FIGS. 5A to 5E are explanatory diagrams of manufacturing of an optical rectenna.

First, the substrate 26 including glass, resin, silicon, or the like is prepared (step S11).

Next, a $SiO_2$ layer as the insulator 23 is formed on the surface of the substrate 26 by a chemical vapor deposition (CVD) method, a coating method, or a physical vapor deposition (PVD) method (step S12).

In this case, the thickness of the $SiO_2$ layer as the insulator 23 is, for example, about 1 μm.

Subsequently, a photoresist PR is applied to the surface of the $SiO_2$ layer as the insulator 23, exposure and development of a predetermined pattern are performed, and a portion other than the region where the fixed charge portion 24 is formed is masked (step S13).

Figure 5A:
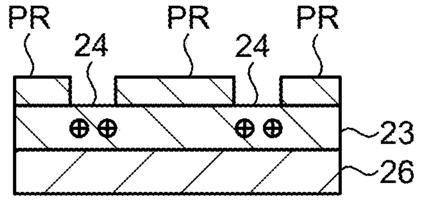
FIGS. 5A to 5E are explanatory diagrams of manufacturing of an optical rectenna.

Next, according to ion implantation, elements such as carbon (C) and nitrogen (N) are ionized, accelerated and shot by applying a voltage, and implanted as impurities into the $SiO_2$ layer as the insulator 23 to form the fixed charge portion 24 as illustrated in FIG. 5A (step S14).

Subsequently, the photoresist PR is removed by an oxygen asher, chemical treatment, or the like (step S15).

Next, the buried electron supply wiring 25 is formed (step S16).

Specifically, the photoresist PR is applied to the $SiO_2$ layer as the insulator 23 including the fixed charge portion 24, exposure and development of a predetermined pattern are performed, and a trench having a shape corresponding to the pattern of the buried electron supply wiring is formed by reactive ion etching (RIE).

Figure 5B:
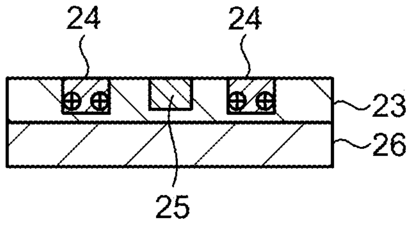

Thereafter, the photoresist is removed, metal filling is performed, the surface is planarized by chemical mechanical polishing (CMP), and the buried electron supply wiring 25 is formed as illustrated in FIG. 5B.

Next, the emitter electrode 21 as an antenna and the anode electrode 22 as an electron receiving electrode are formed (step S17).

In this step, the emitter electrode 21 and the anode electrode 22 as the electron receiving electrode are formed in such a manner that a fixed charge portion 24 is positioned on the side of the path at a position along the path in which the electrons emitted from the emitter electrode 21 move toward the anode electrode 22, or that the fixed charge portion 24 is positioned on the path between the position where the emitter electrode 21 is formed and the position where the anode electrode 22 is formed.

Specifically, a metal film for forming the emitter electrode 21 and the anode electrode 22 is formed first.

Tungsten (W), titanium (Ti), molybdenum (Mo), gold (Au), nickel (Ni), niobium (Nb), or the like is used as metal for forming the emitter electrode 21 as an antenna or the anode electrode 22 as an electron receiving electrode. In this case, a metal containing nitrogen (N) or carbon (C) in the composition can also be used.

Subsequently, a photoresist is formed, a metal film other than a portion where the emitter electrode 21 as an antenna and the anode electrode 22 as an electron receiving electrode are formed is removed by RIE, and then the photoresist is removed.

In this way, the emitter electrode 21 as an antenna and the anode electrode 22 as an electron receiving electrode are formed.

The above is a description for a case in which the emitter electrode 21 as an antenna and the anode electrode 22 as an electron receiving electrode are simultaneously formed, but the emitter electrode 21 and the anode electrode 22 may be formed separately.

Figure 5C:
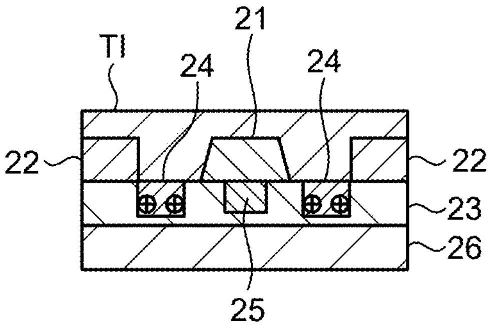

Subsequently, as illustrated in FIG. 5C, a tunnel insulating film TI having a role of protecting the electrode tip so as not to be exposed is formed by a CVD method or an atomic layer deposition (ALD) method (step S18).

In this case, the tunnel insulating film TI may be laminated thick to also serve as a protection film.

As will be described later, it is also possible not to form the tunnel insulating film depending on subsequent processes.

Subsequently, a passivation membrane is formed (step S19).

This passivation membrane provides mechanical protection and moisture prevention for optical rectennas.

Figure 5D:
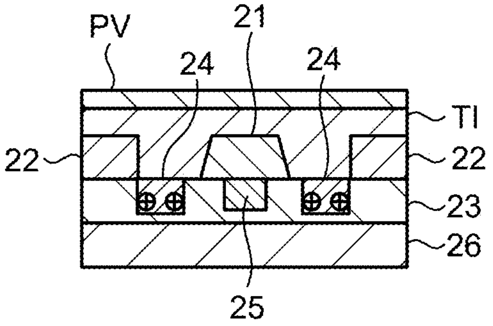

Therefore, when the tunnel insulating film TI is formed and the space between the emitter electrode 21 as an antenna and the anode electrode 22 as an electron receiving electrode is filled as illustrated in FIG. 5C, a passivation membrane PV is formed by a plasma enhanced chemical vapor deposition (PE-CVD) method or the like as illustrated in FIG. 5D.

Figure 5E:
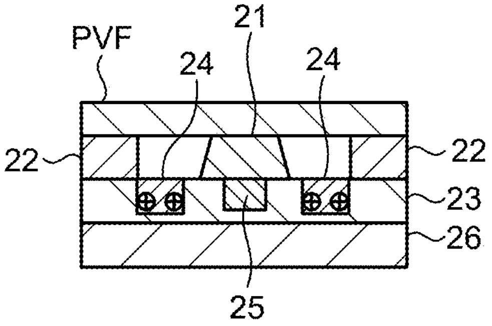

In a case in which the tunnel insulating film TI is not provided, it is also possible to bond another substrate having optical transparency to the surface, or to bond a passivation film PVF to the surface as illustrated in FIG. 5E.

Although not described in the above description, cleaning, heat treatment, or the like can be performed between the processes, if needed.

Figure 6:
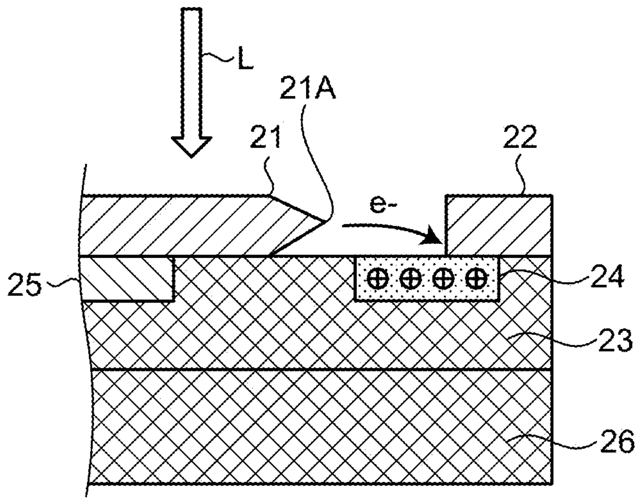
FIG. 6 is an explanatory diagram of an operation of the embodiment.

FIG. 6 is an explanatory diagram of an operation of the embodiment.

As illustrated in FIG. 6, when light L having a predetermined wavelength is incident on the emitter electrode 21 functioning as an antenna in the optical rectenna 11, free electrons $e^-$ in the emitter electrode 21 receive a force from an electric field of the light.

This enables the electrons $e^-$ to be emitted from each of tips (both ends) 21A of the emitter electrode 21 in the direction of the anode electrode 22 at the position opposing each other (in the case of the example of FIG. 6, the right direction).

In this state, in the vicinity of the tip 21A of the emitter electrode 21, the fixed charge portion 24 is formed separated by a predetermined distance in the direction in which the anode electrode 22 is provided, and the potential thereof is a positive potential. Thus, electrons $e^-$ are likely to cause field emission from the tip 21A of the emitter electrode 21. Therefore, compared with a case in which the fixed charge portion 24 is not provided, the emission efficiency is increased, and more electrons $e^-$ are emitted. As a result, the effective photoelectric conversion rate is increased.

The electrons $e^-$ emitted from the tip 21A of the emitter electrode 21 then reach the anode electrode 22, and the photoelectric conversion is completed.

The output direct current of the optical rectenna 11 is supplied to the DC/DC converter 12 through the terminals T1 and T2.

The DC/DC converter 12 performs DC/DC conversion of the input power and outputs, to the storage battery unit 13, direct current power having a predetermined direct current voltage that can charge the storage battery unit 13.

As a result, the storage battery unit 13 stores the direct current power output from the DC/DC converter and supplies the stored direct current power to the coupled load LD.

As described above, according to the present embodiment, the electromotive force required for field emission can be reduced to cause field emission more easily, and the photoelectric conversion efficiency can be improved in the optical rectenna.

As a result, an optical rectenna, which is a photovoltaic element capable of generating power with high efficiency, can be obtained.

(1.1) First Modification

Figure 7:
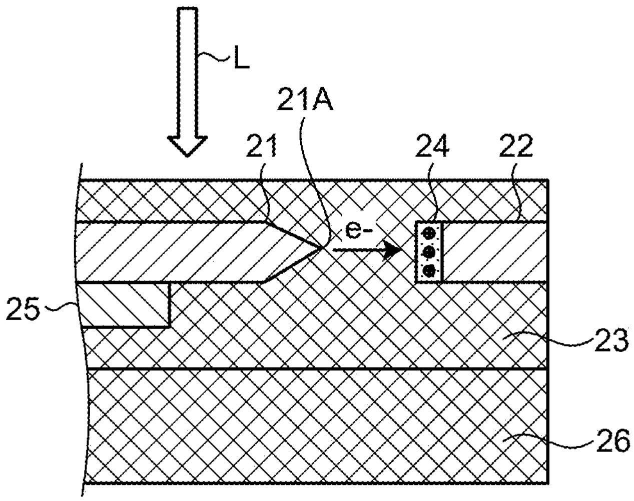
FIG. 7 is an explanatory diagram of a first modification.

FIG. 7 is an explanatory diagram of a first modification.

In the above description of the first embodiment, the fixed charge portion 24 is provided along the path in which the electrons $e^-$ emitted from the tip 21A of the emitter electrode 21 move toward the anode electrode 22. However, in the first modification, the fixed charge portion 24 is provided between the emitter electrode 21 and the anode electrode 22 at a position opposing the tip 21A of the emitter electrode 21 in a state in which the emitter electrode 21, the anode electrode 22, and the fixed charge portion 24 are buried in the insulator 23.

According to this configuration, as illustrated in FIG. 7, when the light L having a predetermined wavelength is incident on the emitter electrode 21 functioning as an antenna in the optical rectenna 11, free electrons $e^-$ in the emitter electrode 21 receive a force from an electric field of the light, move toward each of the tips (both ends) 21A of the emitter electrode 21, and concentrate at the tips 21A. This enables the electrons $e^-$ to be emitted from each of the tips (both ends) 21A of the emitter electrode 21 in the direction of the fixed charge portion 24 at the position opposing each other (in the case of the example of FIG. 7, the right direction).

In this state, the fixed charge portion 24 having a positive potential at a position separated by a predetermined distance from the emitter electrode 21 is formed at the end portion of the anode electrode 22. Thus, electrons $e^-$ are likely to cause field emission from the tip 21A of the emitter electrode 21. Therefore, compared with a case in which the fixed charge portion 24 is not provided, the emission efficiency is increased, and more electrons $e^-$ are emitted. As a result, the effective photoelectric conversion rate is increased. The electrons $e^-$ emitted from the tip 21A of the emitter electrode 21 passes through the fixed charge portion 24 and finally reach the anode electrode 22, and the photoelectric conversion is completed.

As described above, according to the present first modification as well, the electromotive force required for field emission can be reduced to cause field emission more easily, and the photoelectric conversion efficiency can be improved in the optical rectenna.

As a result, an optical rectenna, which is a photovoltaic element capable of generating power with high efficiency, can be obtained.

(1.2) Second Modification

In the above description of the first embodiment, one optical rectenna has been described, but a plurality of optical rectennas can be simultaneously formed in the same processes as the above-described processes.

Figure 8:
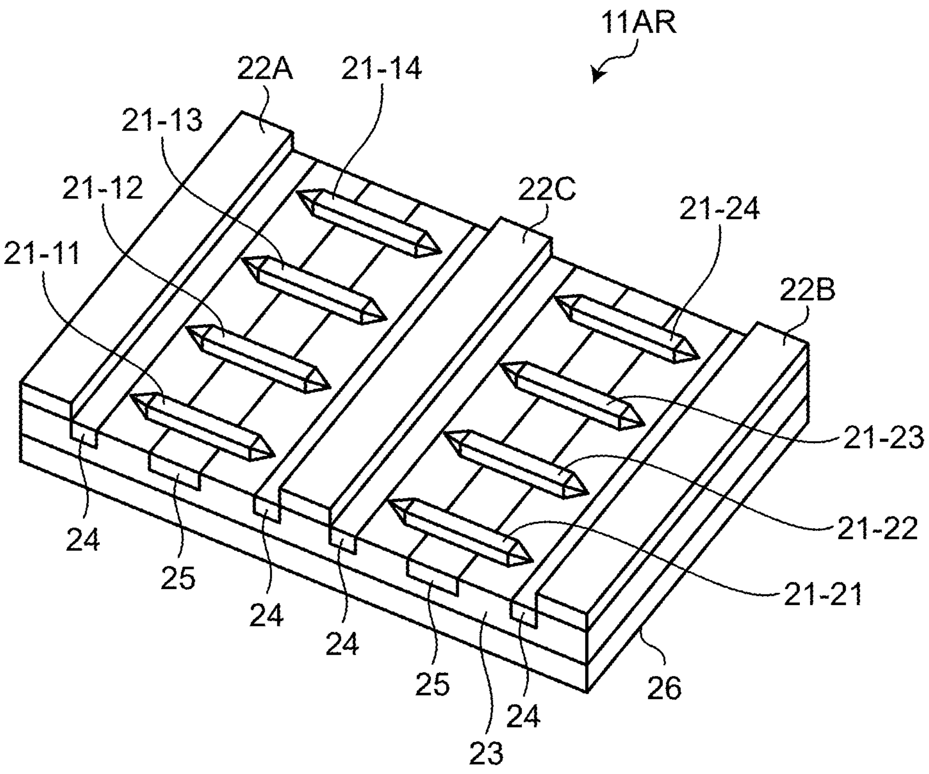
FIG. 8 is an external perspective view of a second modification.

FIG. 8 is an external perspective view of a second modification.

In FIG. 8, portions/units same as those in FIG. 3 are denoted by the same reference signs.

As illustrated in FIG. 8, the optical rectenna array 11AR can also be configured by two-dimensionally disposing a plurality of antennas.

The example of FIG. 8 is a case in which the optical rectenna array 11AR having eight emitter electrodes 21-11 to 21-14 and 21-21 to 21-24 is configured.

The optical rectenna array 11AR includes the emitter electrodes 21-11 to 21-14 and 21-21 to 21-24, a pair of anode electrodes 22A and 22B, a common anode electrode 22C, the insulator 23, the fixed charge portion 24, the buried electron supply wiring 25, and the substrate 26.

In the example of FIG. 8, the pair of anode electrodes 22A and 22B and the common anode electrode 22C have been described to facilitate understanding. However, when the actual optical rectenna array 11AR is configured, emitter electrodes each functioning as the emitter electrode 21 and anode electrodes each functioning as the anode electrode 22A or 22B or the common anode electrode 22C are countlessly disposed on a plane.

The emitter electrodes 21-11 to 21-14 function as antennas, are formed between the anode electrode 22A and the common anode electrode 22C, and emit electrons ($e^-$), obtained by receiving incident light and photoelectrically converting the received light, to the anode electrode 22A side and the common anode electrode 22C side.

Similarly, the emitter electrodes 21-21 to 21-24 function as antennas, are formed between the anode electrode 22B and the common anode electrode 22C, and emit electrons ($e^-$) obtained by receiving incident light and photoelectrically converting the received light to the anode electrode 22B side and the common anode electrode 22C side.

In this case, each of both end portions of the emitter electrodes 21-11 to 21-14 and 21-21 to 21-24 has a shape that is gradually thinned, for the purpose of facilitating field emission.

The anode electrodes 22A and 22B and the common anode electrode 22C absorb electrons emitted from the emitter electrodes 21-11 to 21-14 and 21-21 to 21-24.

In this case, the anode electrodes 22A and 22B and the common anode electrode 22C are each disposed, for example, at a position separated by about 20 nm from the corresponding tip of the emitter electrodes 21-11 to 21-14 and 21-21 to 21-24.

The insulator 23 supports the emitter electrodes 21-11 to 21-14 and 21-21 to 21-24, the anode electrodes 22A and 22B, and the common anode electrode 22C.

Since the configurations of the fixed charge portion 24, the buried electron supply wiring 25, and the substrate 26 are the same as those of the first embodiment, the detailed description thereof is incorporated.

Figure 9:
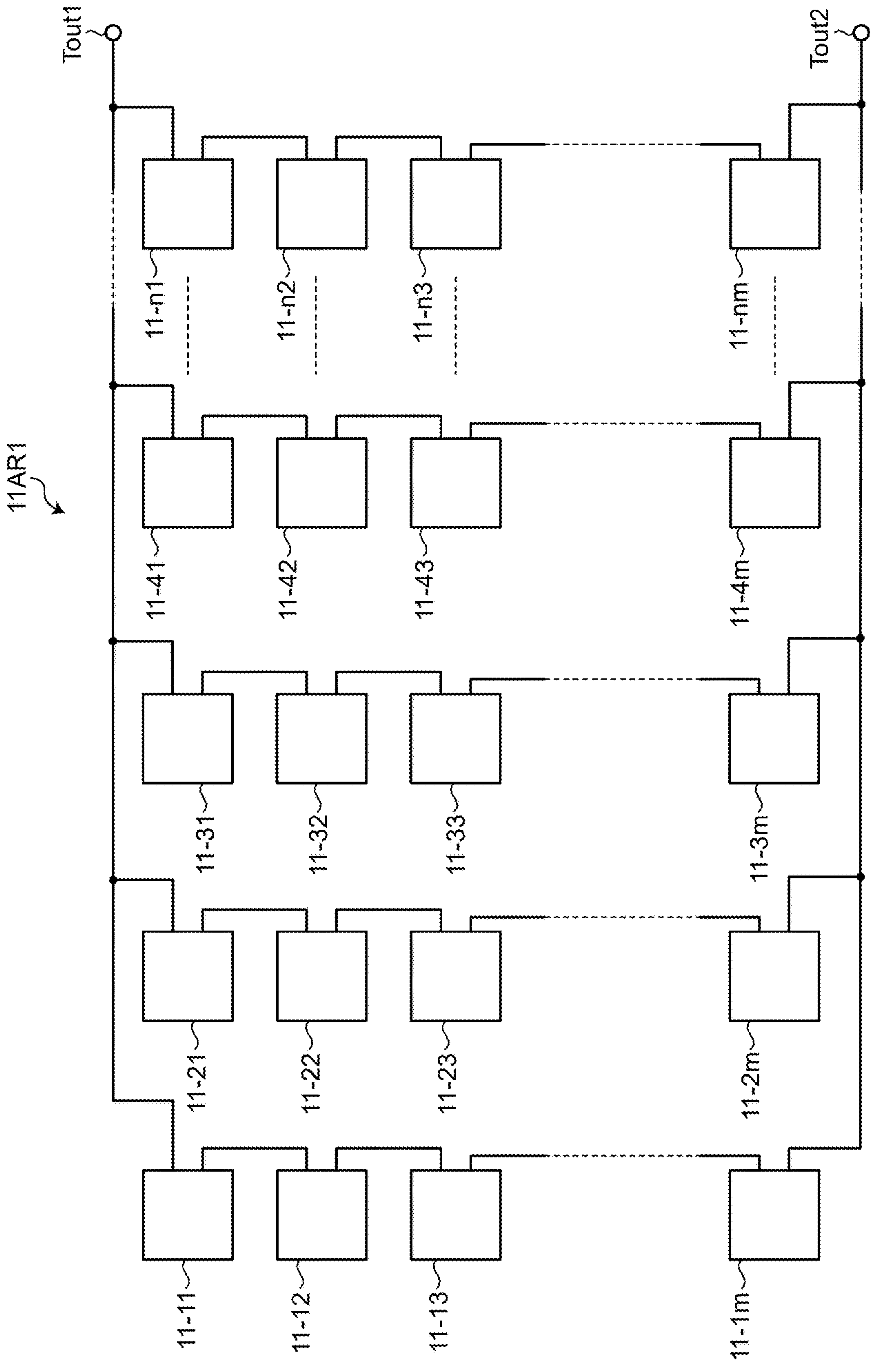
FIG. 9 is an explanatory diagram of an optical rectenna array of the first modification when the optical rectenna is configured by coupling n×m optical rectennas in series and parallel, based on an assumption that the optical rectenna array is used for the same or similar application as a solar cell.

FIG. 9 is an explanatory diagram of an optical rectenna array of the first modification when the optical rectenna is configured by coupling n×m optical rectennas in series and parallel, based on an assumption that the optical rectenna array is used for the same or similar application as a solar cell.

An optical rectenna array 11AR1 includes n×m optical rectennas of optical rectennas 11-11 to 11-1*m*, 11-21 to 11-2*m*, . . . , and 11-*n*1 to 11-*nm*.

As for the optical rectennas 11-11 to 11-1*m* constituting a first optical rectenna group, m optical rectennas are coupled in series.

Similarly, as for the optical rectennas 11-21 to 11-2*m*, . . . , and 11-*n*1 to 11-*nm* constituting second to n-th optical rectenna groups, m optical rectennas are coupled in series for each optical rectenna group.

The first to n-th optical rectenna groups are coupled in parallel with each other.

As a result, the output voltage appearing between output terminals Tout1 and Tout2 of the optical rectenna array 11AR1 is proportional to the voltage of the power generated by each optical rectenna group, that is, the number of optical rectennas in series in the optical rectenna group.

In addition, the output current appearing between the output terminals Tout1 and Tout2 of the optical rectenna array 11AR1 is proportional to the number of optical rectenna groups.

Therefore, between the output terminals Tout1 and Tout2, the desired optical rectenna array 11AR1 can be configured in a manner similar to the solar cell panel or the solar power generation system by determining the number of optical rectennas in series constituting each optical rectenna group and the number of optical rectenna groups in parallel in accordance with the required output voltage and output current.

(2) Second Embodiment

Next, a second embodiment will be described.

The first embodiment described above relates to an optical rectenna device sensitive to a specific wavelength, whereas the present second embodiment is an embodiment of an optical rectenna device including antennas that has different lengths or different antenna extending directions and is sensitive to light having different wavelengths or different polarization planes.

In the optical rectenna device of the present second embodiment, antennas that have different lengths and are sensitive to different wavelengths are respectively provided on different layers, or antennas that have different extending directions and correspond to light having different polarization planes are respectively provided on different layers.

Figure 10:
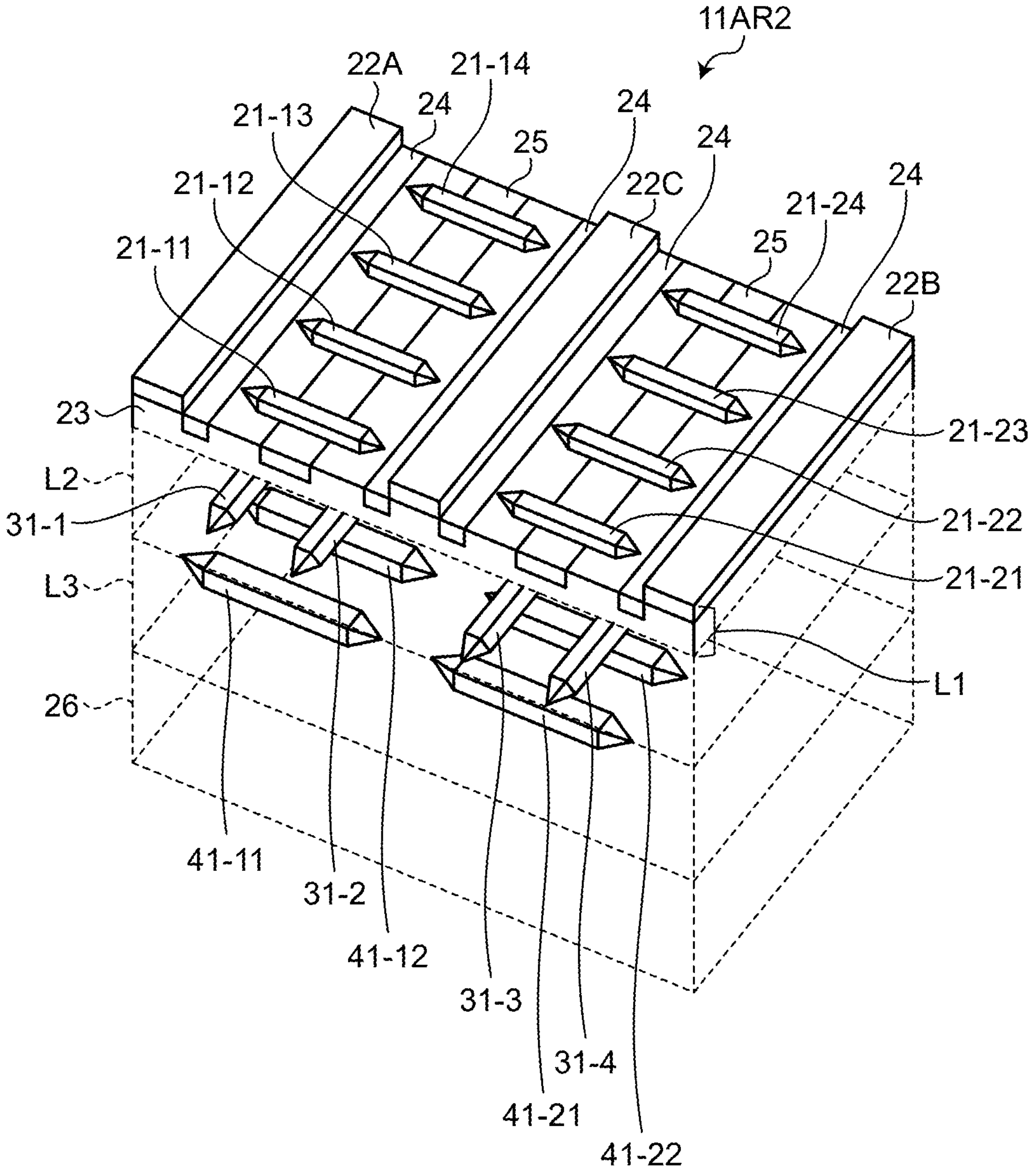
FIG. 10 is an explanatory perspective view of a schematic configuration of a three-layer optical rectenna array according to a second embodiment.

FIG. 10 is an explanatory perspective view of a schematic configuration of a three-layer optical rectenna array according to a second embodiment.

In FIG. 10, portions/units same as those in FIG. 8 are denoted by the same reference signs, and the detailed description thereof is incorporated.

In FIG. 10, although a second layer L2 and a third layer L3 have the same configuration as that of a first layer L1, but only antennas are illustrated to facilitate understanding.

In an optical rectenna array 11AR2, the first layer L1, the second layer L2, and the third layer L3 are laminated on a substrate 26 from the top to the bottom in FIG. 10.

Here, each of the first layer L1, the second layer L2, and the third layer L3 functions as a photoelectric conversion layer.

The first layer L1 adopts a configuration same as that of the modification of the first embodiment.

In the second layer L2, emitter electrodes 31-1 to 31-4 extending in a direction orthogonal to the extending direction of emitter electrodes 21-11 to 21-14 and 21-21 to 21-24 (functioning as antennas) provided in the first layer L1 are provided. As a result, the emitter electrodes 31-1 to 31-4 are configured as antennas having high sensitivity to light having a polarization plane orthogonal to the polarization plane of light received by the emitter electrodes 21-11 to 21-14 and 21-21 to 21-24 of the first layer L1.

In the third layer L3, emitter electrodes 41-11, 41-12, 41-21, and 41-22 having the same extending direction as but different lengths from the emitter electrodes 21-11 to 21-14 and 21-21 to 21-24 (functioning as antennas) provided in the first layer L1 are provided. As a result, the emitter electrodes 41-11, 41-12, 41-21, and 41-22 are configured as antennas having high sensitivity to light having a wavelength different from the wavelength of light received by the emitter electrodes 21-11 to 21-14 and 21-21 to 21-24 of the first layer L1.

By adopting such a configuration, photoelectric conversion can be performed using light having various polarization directions or light having various wavelengths. Thus, photoelectric conversion can be performed with high efficiency in a case in which the effective areas of photoelectric conversion of the optical rectenna arrays 11AR1 are the same.

Therefore, a large-scale photovoltaic system with higher power generation efficiency per installation area can be easily constructed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion device comprising:

an emitter electrode that receives incident light having a predetermined wavelength and emits electrons;

an anode electrode that absorbs the electrons;

an insulator that supports the emitter electrode and the anode electrode; and a fixed charge portion that generates an electric field for giving the electrons a potential to help to jump out from the emitter electrode and move toward the anode electrode.

2. The photoelectric conversion device according to claim 1, wherein the fixed charge portion is formed on the insulator or at a predetermined position in the insulator.

3. The photoelectric conversion device according to claim 2, wherein the predetermined position is: on a side of a path along which electrons emitted from the emitter electrode move toward the anode electrode; or on the path between the emitter electrode and the anode electrode.

4. A photovoltaic device comprising:

a plurality of the photoelectric conversion devices according to claim 1, wherein the plurality of photoelectric conversion devices are coupled in series, in parallel, or in series and parallel.

5. A photoelectric conversion device comprising a plurality of photoelectric conversion layers each including:

an emitter electrode that receives incident light having a predetermined wavelength and emits electrons;

an anode electrode that absorbs the electrons;

an insulator that supports the emitter electrode and the anode electrode; and a fixed charge portion that generates an electric field for giving the electrons a potential to help to jump out from the emitter electrode and move toward the anode electrode, wherein a length of the emitter electrode is set in such a manner that the predetermined wavelength is different for each of the plurality of photoelectric conversion layers.

6. A photovoltaic device comprising:

a plurality of the photoelectric conversion devices according to claim 5, wherein the plurality of photoelectric conversion devices are coupled in series, in parallel, or in series and parallel.

7. A photoelectric conversion device comprising a plurality of photoelectric conversion layers each including:

an emitter electrode that receives incident light having a predetermined wavelength and emits electrons;

an anode electrode that absorbs the electrons;

an insulator that supports the emitter electrode and the anode electrode; and a fixed charge portion that generates an electric field for giving the electrons a potential to help to jump out from the emitter electrode and move toward the anode electrode, wherein an orientation of the emitter electrode is set corresponding to a polarization plane of the incident light to be received, to be different for each of the plurality of photoelectric conversion layers.

8. A photovoltaic device comprising:

a plurality of the photoelectric conversion devices according to claim 7, wherein the plurality of photoelectric conversion devices are coupled in series, in parallel, or in series and parallel.

9. A method for manufacturing a photoelectric conversion device including: an emitter electrode that receives incident light having a predetermined wavelength and emits electrons; an anode electrode that absorbs the electrons; and an insulator that supports the emitter electrode and the anode electrode, the method comprising:

forming a fixed charge portion on the insulator; and forming the emitter electrode and the anode electrode in such a manner that the fixed charge portion is positioned: on a side of a path along which electrons emitted from the emitter electrode move toward the anode electrode; or on the path between the position where the emitter electrode is formed and the position where the anode electrode is formed.

* * * * *